United States Patent
Jain

(10) Patent No.: US 11,164,614 B1
(45) Date of Patent: Nov. 2, 2021

(54) MEMORY ARCHITECTURE

(71) Applicant: Taiwan Semiconductor Manufacturing Company Limited, Hsinchu (TW)

(72) Inventor: Sanjeev Kumar Jain, Ottawa (CA)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/925,512

(22) Filed: Jul. 10, 2020

(51) Int. Cl.
*G11C 8/10* (2006.01)
*G11C 8/12* (2006.01)
*G11C 8/18* (2006.01)

(52) U.S. Cl.
CPC .............. *G11C 8/10* (2013.01); *G11C 8/12* (2013.01); *G11C 8/18* (2013.01)

(58) Field of Classification Search
CPC .............. G11C 8/10; G11C 8/18; G11C 8/12
See application file for complete search history.

(56) References Cited

U.S. PATENT DOCUMENTS

| | | | | |
|---|---|---|---|---|
| 5,848,024 A * | 12/1998 | Cho | .......................... | G11C 7/22 365/230.06 |
| 5,982,703 A * | 11/1999 | Oh | ........................ | G11C 7/1027 365/230.06 |
| 6,055,194 A * | 4/2000 | Seo | ........................ | G11C 7/1018 365/194 |
| 6,292,430 B1 * | 9/2001 | Ohtake | ................. | G11C 7/1072 365/189.05 |
| 6,337,816 B1 * | 1/2002 | Park | ...................... | G11C 29/846 365/200 |
| 8,923,090 B1 * | 12/2014 | Evans | ....................... | G11C 8/06 365/230.06 |
| 8,934,308 B2 * | 1/2015 | Wang | ........................ | G11C 7/22 365/191 |
| 9,128,817 B2 * | 9/2015 | Kim | ..................... | G06F 12/0207 |
| 10,854,280 B2 * | 12/2020 | Singh | ..................... | G11C 11/419 |
| 2001/0000693 A1 * | 5/2001 | Hamamoto | ............... | G11C 8/18 365/230.08 |
| 2009/0231937 A1 * | 9/2009 | Jung | ..................... | G11C 7/1072 365/194 |

* cited by examiner

Primary Examiner — Khamdan N. Alrobaie
(74) Attorney, Agent, or Firm — Jones Day

(57) ABSTRACT

Systems and method are provided for a memory circuit. A predecoder circuit is configured to receive a first address signal, a first clock signal, and a second clock signal. The predecoder circuit is configured to generate a selection signal based on the first clock signal and the first address signal. And the predecoder circuit is further configured to maintain the selection signal based on the second clock signal and the first address signal.

20 Claims, 9 Drawing Sheets

MEMORY ARCHITECTURE

BACKGROUND

A memory is typically divided into logical units of storage, such as memory banks, words of memory, bytes of memory, and bits of memory. Control signals are routed to memory units to initiate operations, such as read and write operations. Time delays in generating and transmitting control signals can adversely affect memory performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
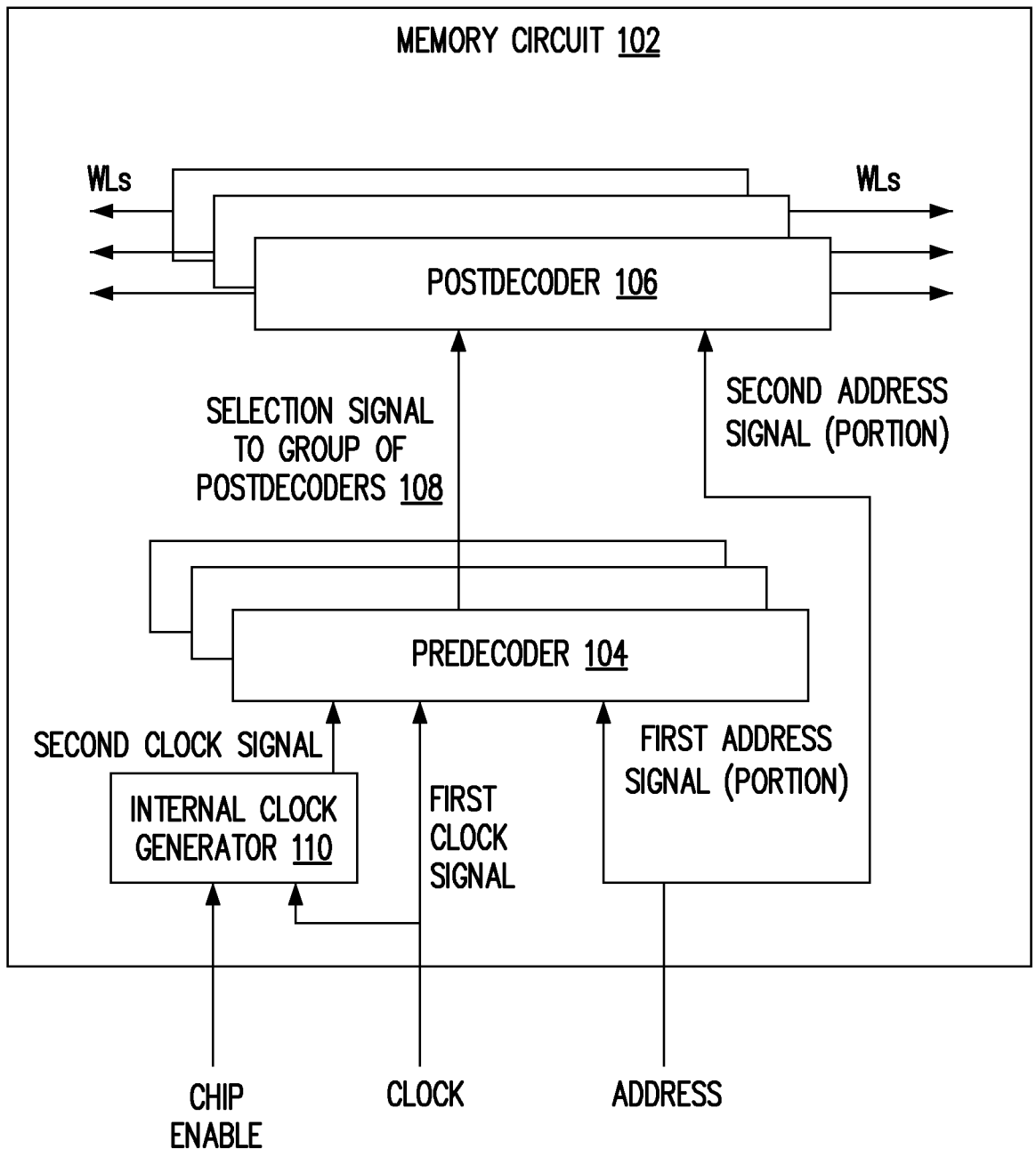
FIG. 1 is a diagram depicting a memory circuit that is configured to generate command signals based on a first clock signal and to maintain those command signals based on second clock signal in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Memory devices are typically implemented by activating/transmitting commands (e.g., word line activation commands, column read commands, word line/bit line pre-charge commands, sense amplifier pre-charge commands, sense amplifier enable commands, read driver commands, write driver commands) to memory units, e.g., memory banks, which are often implemented via multiple memory arrays (e.g., a left array and a right array of a memory bank, three memory arrays of a memory bank). Each memory array contains a plurality of memory cells, typically arranged in rows (e.g., words) and columns. The time that it takes to generate and transmit commands to memory units can be a drag on memory operation speed.

Systems and methods as described herein can, in embodiments, reduce the time that it takes for memory command and control signals to reach their destination within the memory after corresponding commands are received (e.g., commands from outside of the memory). By using a first clock signal, such as a clock signal received from outside the memory with limited or no processing (directly), to initiate certain commands, memory latency can be reduced. In some implementations, those commands initiated by the first clock are then maintained (e.g., held in an active state) using a second clock signal generated with additional processing (e.g., using logic that operates on both the first clock signal and a chip enable signal). The use of the first clock signal can jump start command signal generation, resulting in performance speed gains.

FIG. 1 is a diagram depicting a memory circuit that is configured to generate command signals based on a first clock signal and to maintain those command signals based on second clock signal in accordance with an embodiment of the disclosure. The memory circuit 102 provides command and data signals to units of memory (e.g., memory banks, memory arrays, memory words memory cells). Those units of memory (not shown in FIG. 1) are positioned at the destinations of control signals (e.g., the word line (WL) signals). The memory circuit receives command and control signals from outside of the memory. In the example of FIG. 1, the memory circuit includes pins for receiving a chip enable (CE) command, a clock input, and an address (e.g., a string of bits indicating which unit of memory data is to be written to or read from). As depicted in later figures herein, the memory circuit is also responsive to input data to be written to the memory on data input pins (D-pins) and output data read from the memory on data output pins (Q-pins).

In certain embodiments, decoding of an address associated with a command is performed in multiple steps. In a first step, one or more predecoders 104 analyze a first portion of a received address (e.g., bits 0-M of the address) to identify a larger unit of memory (e.g., a particular memory array, a particular memory bank) to which a command (e.g., a data write or a data read) is directed. Each predecoder is associated with a particular one or more of those larger units of memory and is connected to a set of postdecoders 106 that are also associated with that particular unit of memory. When a predecoder 104 determines that its particular unit of memory is a destination of a command, it sends a selection signal (e.g., a clock signal, an activation signal) 108 to postdecoders 106 associated with the particular unit of memory. The postdecoders 106 are each associated with a subset of the particular unit of memory (e.g., a word of memory within the particular unit of memory). Each postdecoder 106 analyzes a second portion of the received address (e.g. bits M+1 to N of the address) to identify the subset of the particular unit of memory to which the command is directed. Upon receipt of the selection signal 108 and determining that its particular subset of memory is the destination of a command, the postdecoder 106 generates a command signal (e.g., a word line activation signal (WL)) to its particular subset of memory.

In the example of FIG. 1, the predecoder 104 generates the selection signal 108, in the form of an internal clock signal provided to its associated set of postdecoders 106, based on a first clock signal, a second clock signal, and the first address signal (i.e., a first portion of the address signal). The predecoder circuit 104 is configured to generate the selection signal 108 based on the first clock signal and the first address signal. As illustrated in FIG. 1, the first clock signal is received at the predecoder 104 from the external clock pin with little or no (i.e., directly or substantially directly) intermediate processing. This enables prompt initial generation of the selection signal 108. The predecoder 104 is further configured to maintain the selection signal 108 based on the second clock signal and the first address signal. In the example of FIG. 1, the second clock signal is generated based on the first clock signal and the chip enable signal at an internal clock generator 110. The second clock signal that maintains the selection signal 108 confirms that the particular memory circuit 102 is intended to be enabled via the chip enable (CE) signal before a memory operation (e.g., a data write operation) occurs, while the use of the first clock signal to initially generate the selection signal 108 speeds operations in certain embodiments.

Figure 2:
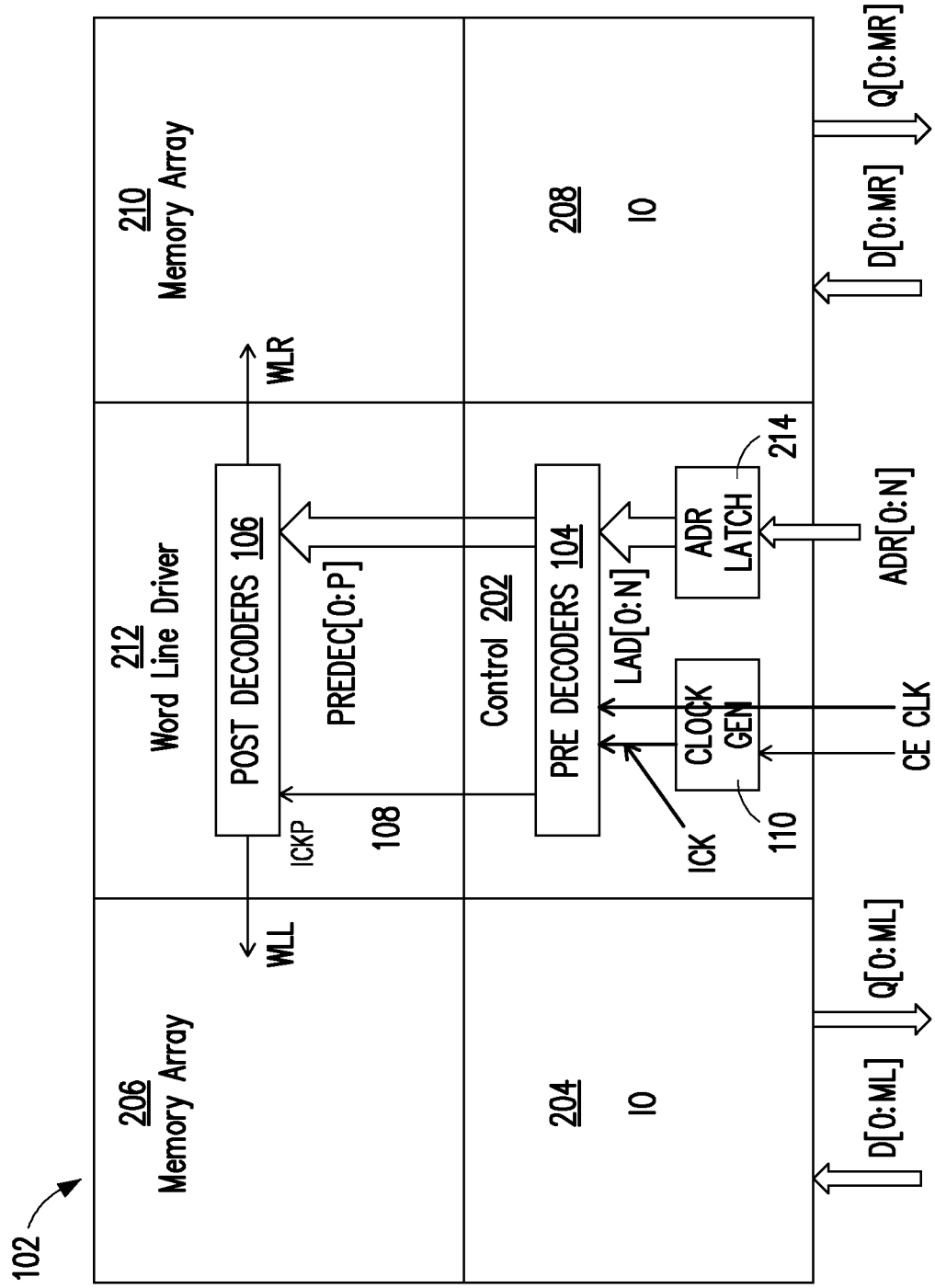
FIG. 2 depicts a memory circuit including its memory arrays in accordance with embodiments of the disclosure.

FIG. 2 depicts a memory circuit including its memory arrays in accordance with embodiments of the disclosure. The memory circuit 102 includes a control portion 202 that receives a clock signal, a chip enable signal (CE) and a set of N+1 address bits (ADR[0:N]) indicating an intended address of a received command. The memory circuit 102 includes a left input/output (IO) section 204 that is configured to receive input data via data input pins D[0:ML] for writing to memory cells of a left memory array 206 and to receive output data read from memory cells of the left memory array 206 to be placed on data output pins Q[0:ML]. Similarly, the memory circuit 102 includes a right input/output (IO) section 208 that is configured to receive input data via data input pins D[0:MR] for writing to memory cells of a right memory array 210 and to receive output data read from memory cells of the right memory array 210 to be placed on data output pins Q[0:MR].

The control portion 202 of the memory circuit 102 includes a plurality of predecoders 104, each associated with a particular unit of memory. For example, one predecoder 104 may be associated with the left and right memory arrays 206, 210 depicted in FIG. 2. Predecoder 104 is configured to provide a selection signal 108 to postdecoders 106 of a word line driver portion 212 of the memory arrays 206, 210 associated with predecoder 104. The predecoder 104 initially generates the selection signal 108 based on a first clock signal (CLK), received in the example of FIG. 2 directly or substantially directly from an external pin, and a first address signal (e.g., a first number of bits of the address received at ADR[0:N] and stored in the address latch 214). The predecoder 104 then maintains the selection signal 108 based on the second click signal (ICLK), received via a clock generator 110 based on the first clock signal and the chip enable signal, and the first address signal.

In the example of FIG. 2, the selection signal 108 takes the form of a clock signal (ICKP) via which one or more of the predecoders 106 generates a corresponding word line activation signal (WLL, WLR) when the second address signal (e.g., a second number of bits of the address signal received at ADR[0:N]) indicate that that postdecoder's memory words are the intended destination of a received command.

Figure 3:
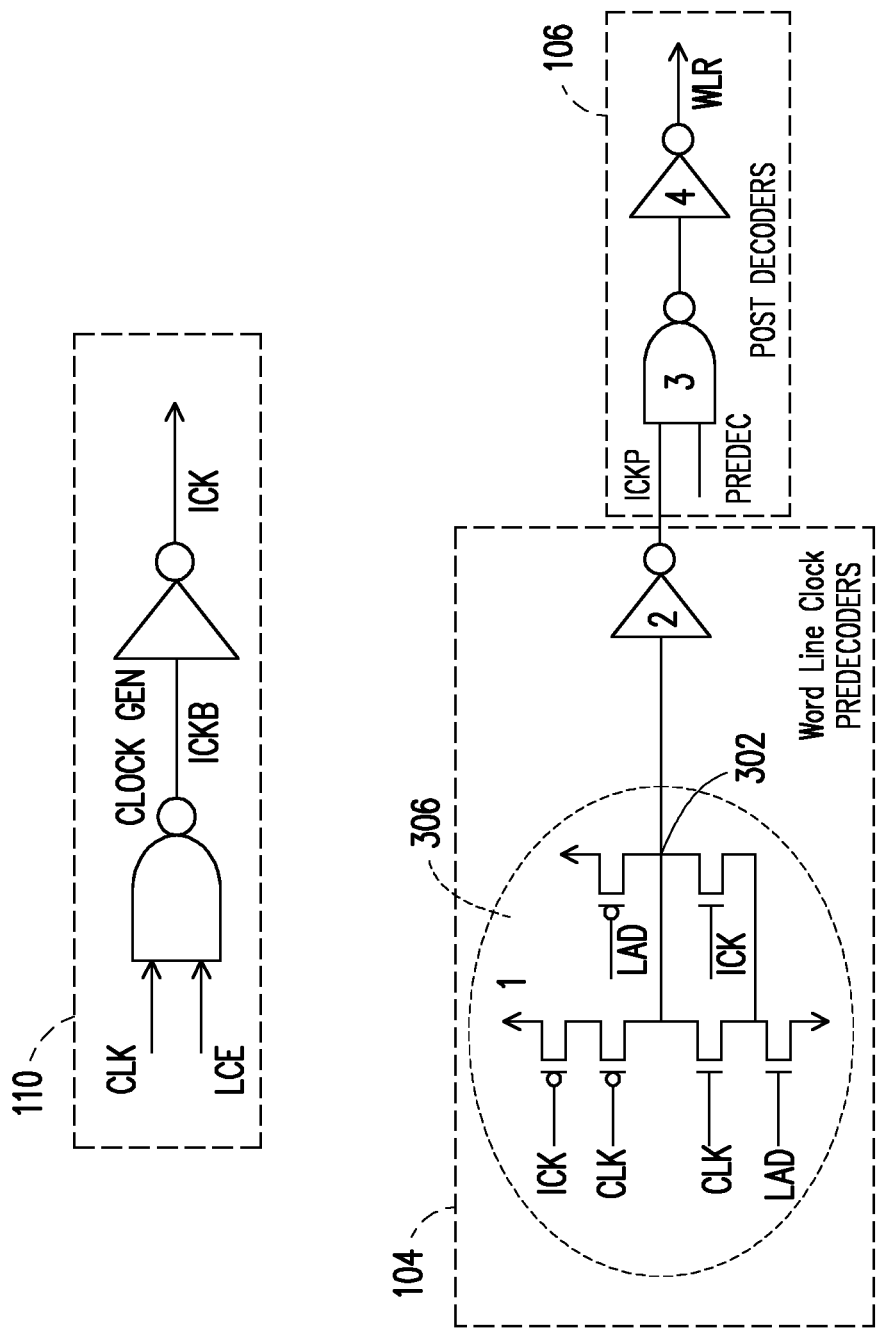
FIG. 3 is a block diagram depicting components of a predecoder, a postdecoder, and a clock generator in accordance with an embodiment.

FIG. 3 is a block diagram depicting components of a predecoder, a postdecoder, and a clock generator in accordance with an embodiment. As described above, the memory circuit receives an external clock signal that may be the basis of the first clock signal (CLK) with or without intermediate processing. The clock generator 110 receives the first clock signal (CLK) and the chip enable signal (LCE) to generate the second clock signal (ICK) via a not-and (NAND) gate and an inverter.

A predecoder 104 is configured to activate by generating a low signal at node 302 that generates a corresponding high selection signal (ICKP) at the predecoder output following an inverter. The predecoder logic 306 before the inverter is configured to precharge node 302 high when the first clock signal (CLK) and the second clock signal (ICK) are low and when the portion of memory associated with the predecoder (e.g., memory arrays 206, 210 in FIG. 2) is not selected as indicated by the first address signal (LAD). The predecoder logic 306 is configured to discharge node 302 and generate a high selection signal (ICKP) when the first clock signal (CLK) and the first address signal (LAD) go high. The predecoder logic 306 is configured to maintain the selection signal (ICKP) when the second clock signal (ICK) and the first address signal (LAD) are high, where the second clock signal (ICK) goes high a period of time after the first clock signal (CLK) goes high.

The postdecoder 106 is configured to generate its word line activation signal (WLR to the right memory array 210) when a selection signal (ICKP) is received from the predecoder 104 indicates that it is in the portion of memory to which a command is directed, and a second address signal (PREDEC (e.g., a second portion of a received address forwarded through predecoder 104)) indicates that its associated word line is the destination of the command. When both the selection signal (ICKP) and the second address signal (PREDEC) are high, the postdecoder's NAND gate and inverter produce a high word line signal (WLR).

Figure 4:
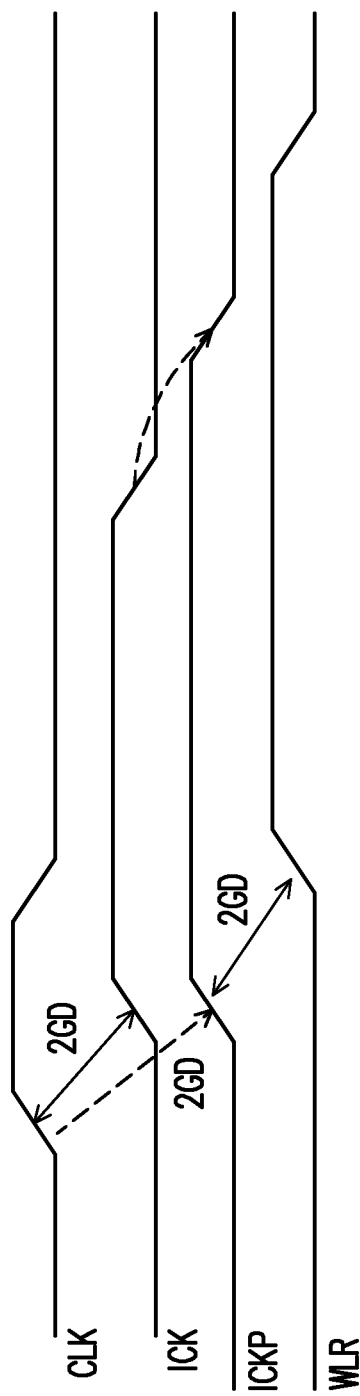
FIG. 4 is a diagram depicting timing of certain signals described with respect to FIG. 3 in accordance with embodiments.

FIG. 4 is a diagram depicting timing of certain signals described with respect to FIG. 3 in accordance with embodiments. Initially, both the first (CLK) and second (ICK) signals are low (as likely is the address signal LAD corresponding to the predecoder 104). During this period, the predecoder logic 306 charges node 302 high, providing a low selection signal (ICKP). When the first clock signal CLK and the first address signal (LAD) go high, the predecoder logic 306 pulls node 302 low within one gate delay (GD), and the predecoder inverter provides a high selection signal (ICKP) within a total of two gate delays (e.g., approximately the signal propagation time through predecoder logic 306 (labeled gate delay 1 in FIG. 3) and the subsequent predecoder 104 inverter (labeled gate delay 2)) from receipt of the first clock signal. The clock generator 110 provides a high second clock signal (ICK) within two gate delays (e.g., approximately the signal propagation time through the NAND gate and inverter of clock generator 110 illustrated in FIG. 3) of receipt of the first clock signal (CLK), and may keep the second clock signal (ICK) active for as long as or longer than the active period of the first clock signal (ICK) (as shown in FIG. 4). The predecoder logic 306 uses that second clock signal (ICK) to maintain the high selection signal (ICKP), even after the first clock signal CLK goes low. In the example of FIG. 4, the first clock signal (CLK) remains high at least until the second clock signal (ICLK) goes high. The postdecoder 106 provides a high word line signal (WLR) within two gate delays (e.g., approximately the signal propagation time through the NAND gate (labeled gate delay 3) and inverter (labeled gate delay 4)) of receiving the high selection signal (ICKP), such that the word line signal is generated within four gate delays of receipt of the first clock signal (CLK).

While the examples of FIGS. 1-4 provide for generation and maintaining of word line activation signals (WL) using first and second clock signals, other memory command and control signals may be similarly generated (e.g., to match the speed gains produced by generating word line activation signals in this manner). Tracking word line signals, bit line precharge signals, read clocks, write clocks, sense amplifier signals, as well as others, may be generated and maintained using systems and methods exemplified herein.

Figure 5:
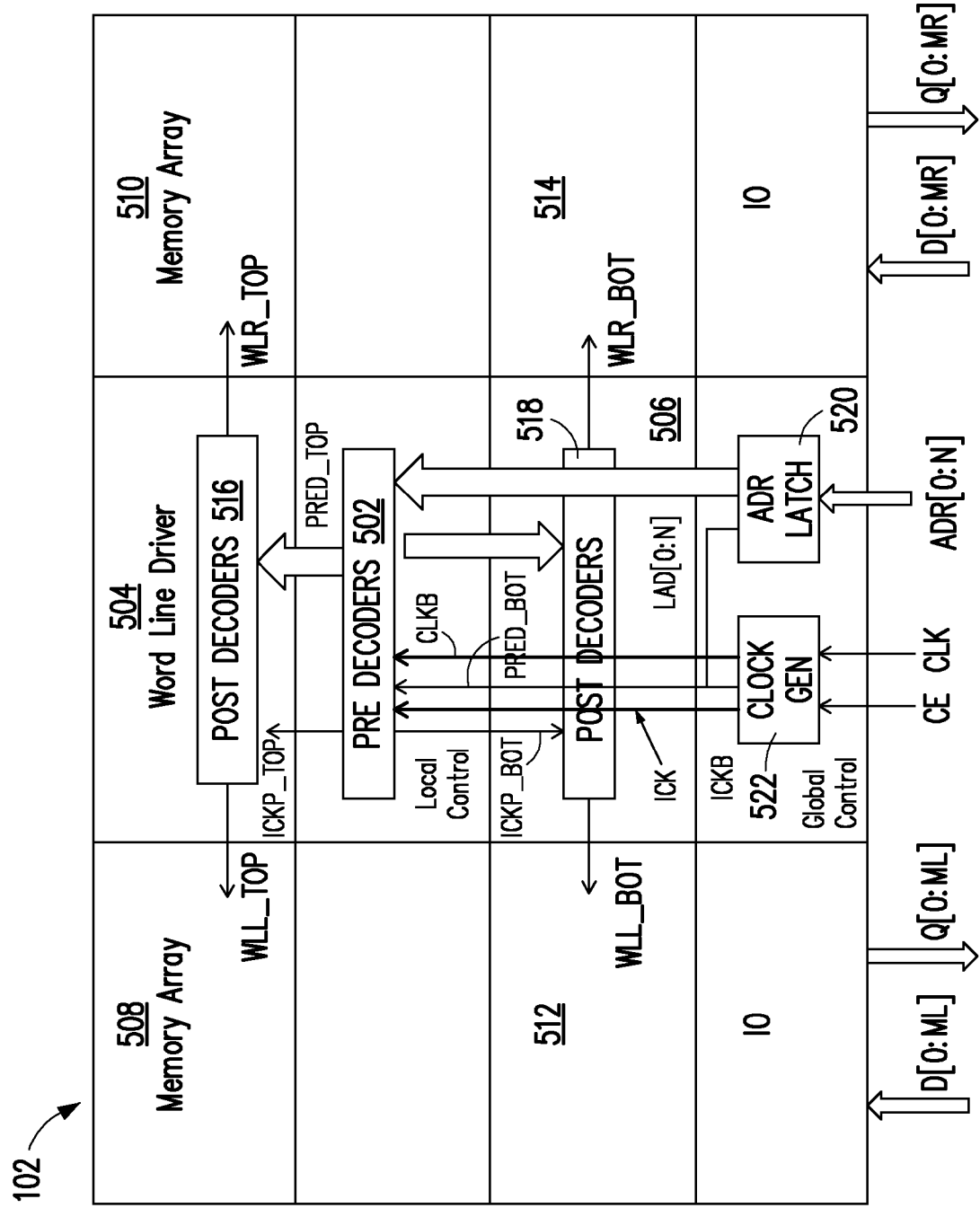
FIG. 5 is a diagram depicting a memory circuit having memory arrays divided into top and bottom portions, in accordance with embodiments.

Systems and methods as described herein may also be applied to other memory architectures as well. FIG. 5 is a diagram depicting a memory circuit having memory arrays divided into top and bottom portions, in accordance with embodiments. In the example of FIG. 5, predecoders 502 are logically positioned between word line drivers 504, 506 for a top portion of a memory array 508, 510 and a bottom portion 512, 514 of a memory array. Predecoder 502 is associated with a particular unit of memory 508, 510, 512, 514. Predecoder 502 is configured to provide a selection signal (ICKP_TOP, ICKP_BOT) to a postdecoder 516, 518 at one (or both) word line drivers 504, 506 associated with predecoder 502's particular unit of memory 508, 510, 512, 514. The predecoder circuit 502 is configured to generate a selection signal (e.g., ICKP_TOP, ICKP_BOT) based on a first clock signal (CLKB) and a first address signal (e.g., the first M bits received at ADR[0:N] stored in address latch 520). The predecoder 502 circuit is further configured to maintain the selection signal based on a second clock signal (ICLK) and the first address signal, the second clock signal (ICLK) being generated by a clock generator circuit 522.

A top array postdecoder 516 receives an active selection signal (ICKP_TOP) and generates a word line activation signal (WLL_TOP, WLR_TOP) based on the received selection signal (ICKP_TOP) and a second address signal (e.g., a second set of bits received as an address at ADR[0:N] that indicate that the word line associated with postdecoder 516 is the intended destination of a received command). The top memory array 508, 510 is responsive to word line signals from the top array postdecoder 516. A bottom array postdecoder 518 receives an active selection signal (ICKP_BOT) and generates a word line activation signal (WLL_BOT, WLR_BOT) based on the received selection signal (ICKP_BOT) and the second address signal. The bottom memory array 512, 514 is responsive to word line signals from the bottom array postdecoder 518.

Figure 6:
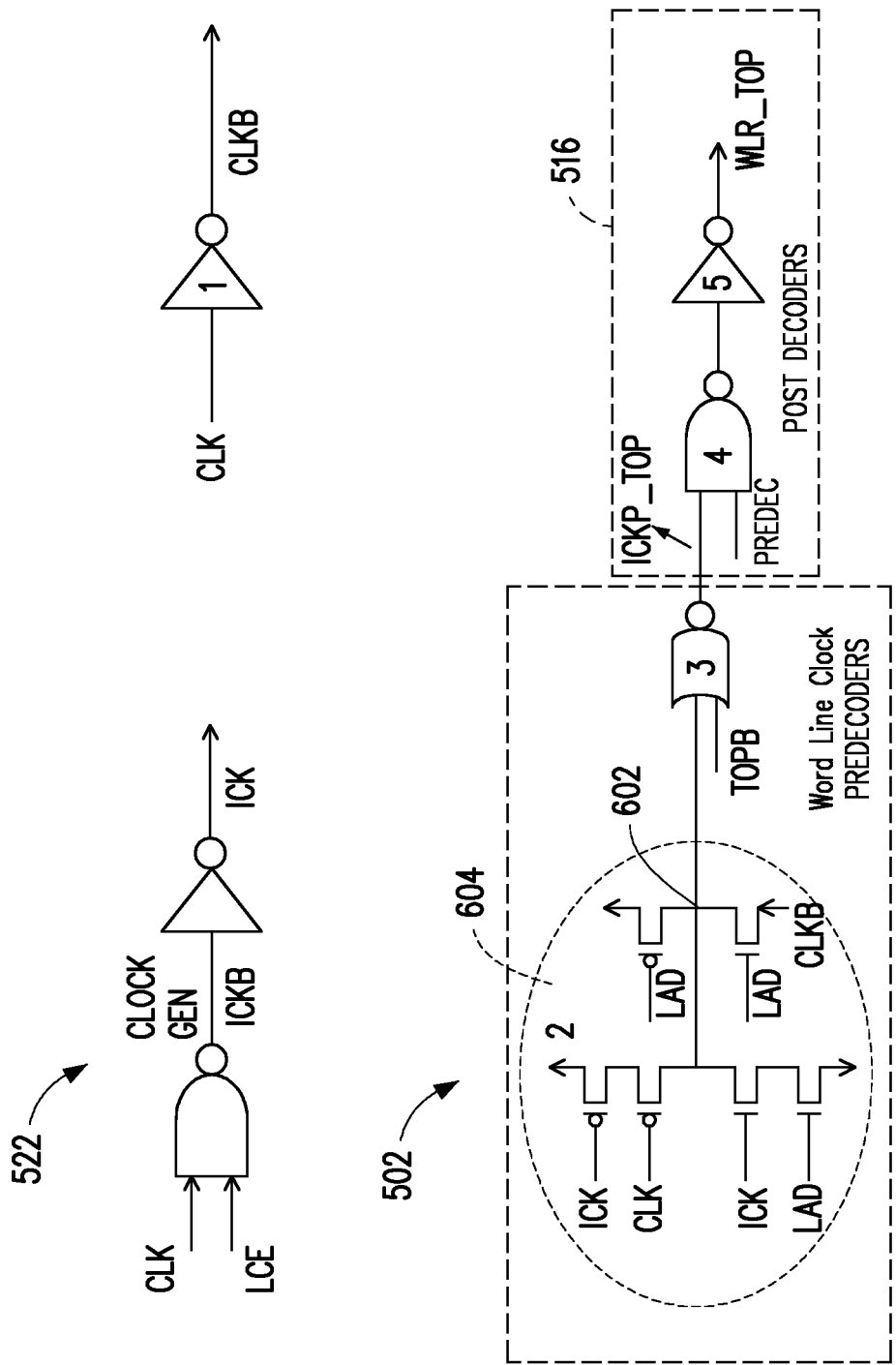
FIG. 6 is a block diagram depicting components of a predecoder, a postdecoder, and a clock generator of FIG. 5 in accordance with an embodiment.

FIG. 6 is a block diagram depicting components of a predecoder, a postdecoder, and a clock generator of FIG. 5 in accordance with an embodiment. As described above, the memory circuit receives an external clock signal that may be the basis of the first clock signal (CLKB) with or without intermediate processing. The clock generator 522 receives the first clock signal (CLKB) and the chip enable signal (LCE) to generate the second clock signal (ICK) via a not-and (NAND) gate and an inverter. The clock generator further generates an inverted first clock signal CLKB via an inverter.

A predecoder 502 is configured to generate a low signal at node 602 that generates a corresponding high selection signal (ICKP_TOP) at the predecoder output following an inverter. The predecoder logic 604 before the inverter is configured to precharge node 602 high when a clock signal (CLK) and the second clock signal (ICK) are low and when the portion of memory associated with the predecoder (e.g., memory arrays 508, 510, 512, 514 in FIG. 5) is not selected as indicated by the first address signal (LAD). The predecoder logic 604 is configured to discharge node 602 and generate a high selection signal (ICKP_TOP) when the first clock signal (CLKB) goes low and the first address signal (LAD) goes high. The predecoder logic 604 is configured to maintain the selection signal (ICKP_TOP) when the second clock signal (ICK) is high and the first address signal (LAD) is high, where the second clock signal (ICK) goes high a period of time after the first clock signal (CLKB) goes low.

The postdecoder 106 is configured to generate its word line activation signal (WLR_TOP to the top right memory array 510) when a selection signal (ICKP_TOP) is received from the predecoder 502 indicates that it is in the portion of memory to which a command is directed, and a second address signal (PREDEC (e.g., a second portion of a received address forwarded through predecoder 502)) indicates that its associated word line is the precise destination of the command. When both the selection signal (ICKP_TOP) and the second address signal (PREDEC) are high, the postdecoder's NAND gate and inverter produce a high word line signal (WLR_TOP). In the example of FIG. 6, the first clock signal (CLK) remains high at least until the second clock signal (ICLK) goes high. The postdecoder 516 provides a high word line signal (WLR_TOP) within two gate delays of receiving the high selection signal (ICKP_TOP), such that the word line signal is generated within five gate delays (e.g., approximately the propagation time of signals through the five gate structures labeled 1, 2, 3, 4, 5 in FIG. 6) of receipt of the first clock signal (CLK).

Figure 7:
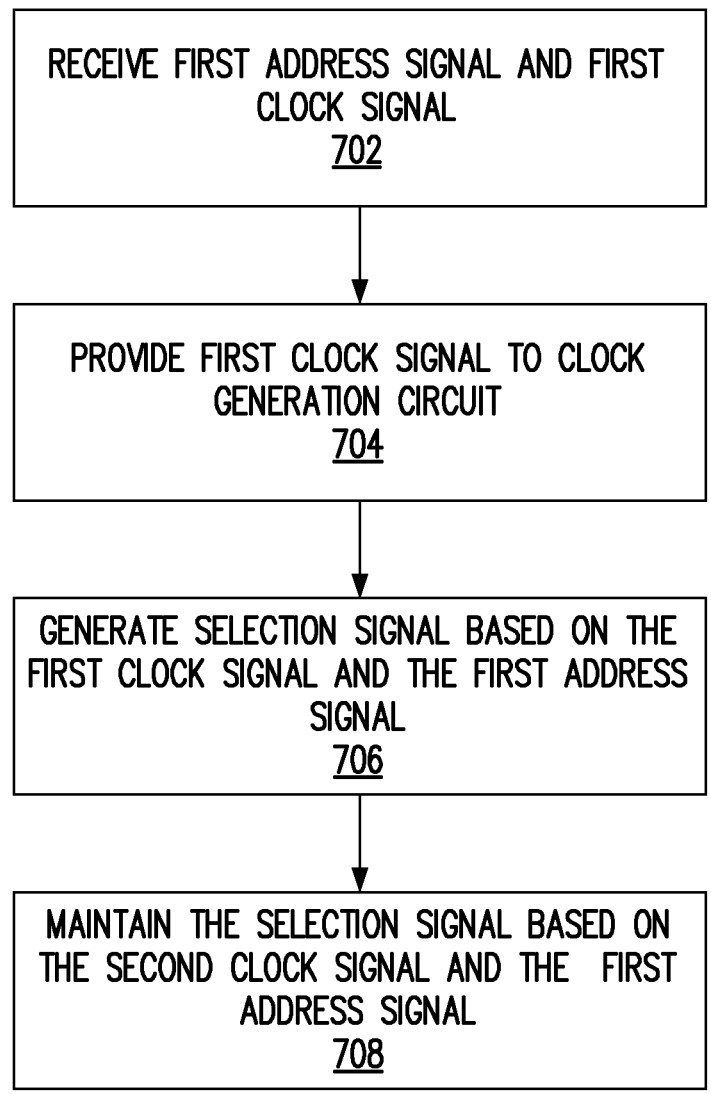
FIG. 7 is a flow diagram depicting steps of a method of operating a memory circuit in accordance with an embodiment.

FIG. 7 is a flow diagram depicting steps of a method of operating a memory circuit in accordance with an embodiment. The method is described with reference to structures described herein above. But the method is applicable to many other structures as well. At 702, a memory circuit 102 receives a first address signal (ADR[0.M]) and a first clock signal (CLK). The first clock signal (CLK) is provided to a clock generation circuit 110 at 704. At 706, a selection signal 108 is generated based on the first clock signal (CLK) and the first address signal (ADR[0.M]), and the selection signal is maintained at 708 based on the second clock (ICK) signal and the first address signal (ADR[0.M]).

Figure 8:
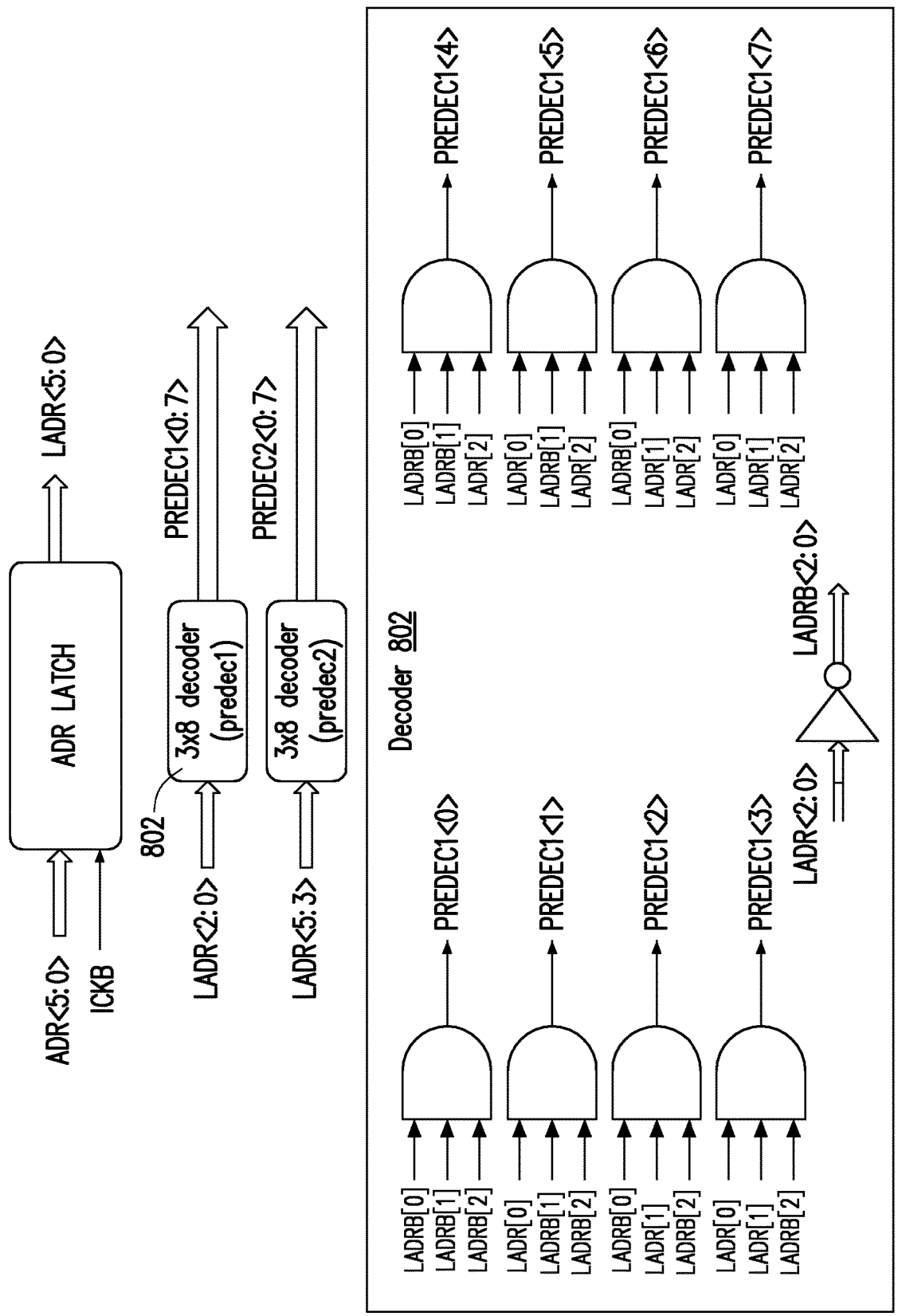
FIG. 8 is a diagram depicting decoder circuitry for generating selection signals to predecoders in accordance with embodiments.

FIG. 8 is a diagram depicting decoder circuitry for generating selection signals to postdecoders in accordance with embodiments. As noted above (e.g., FIG. 3), each post decoder 106 receives a selection signal "PREDEC" based on a second portion of the received address that indicates whether the word line associated with that post decoder is the intended destination of a command. FIG. 8 illustrates and example where the bottom six bit of the address are used to generated the PREDEC signals. Specifically, the bottom six bits of the address (ADR[5.0]) are received at the address latch along with the inverse of the first clock signal (ICKB) to generate the LADR[5.0] signal. A first three bits of that signal (LADR[2:0]) are used by a first decoder 802 to generate selection signals (PREDEC1[0:7]) to a first set of eight post decoders, while a second three bits of that signal (LADR[5:3]) are used by a second decoder to generate selection signals (PREDEC2[0:7]) to a second set of eight post decoders. Further, details of the first decoder 802 are depicted, where a unique combination of the three LADR bits received at the decoder 802 input are associated with each of 8 post decoders to activate word lines in combination with a predecoder selection signal (e.g., ICKP of FIG. 2). For example, a low signal on LADR[0], LADR[1], and LADR[2] would correspond with high signals on LADRB[0], LADRB[1], and LADRB[2] via the inverter depicted at the bottom of the Decoder 802 illustration, which would activate the first decoder AND gate to produce a high signal on PREDEC1<0>. As another example for PREDEC1<4>, a low signal on LADR[0] and LADR[1] would correspond with high signals on LADRB[0] and LADRB[1], which in combination with a high LADR[2] signal would activate the decoder AND gate associated with PREDEC1<4> to produce a high level signal.

Figure 9:
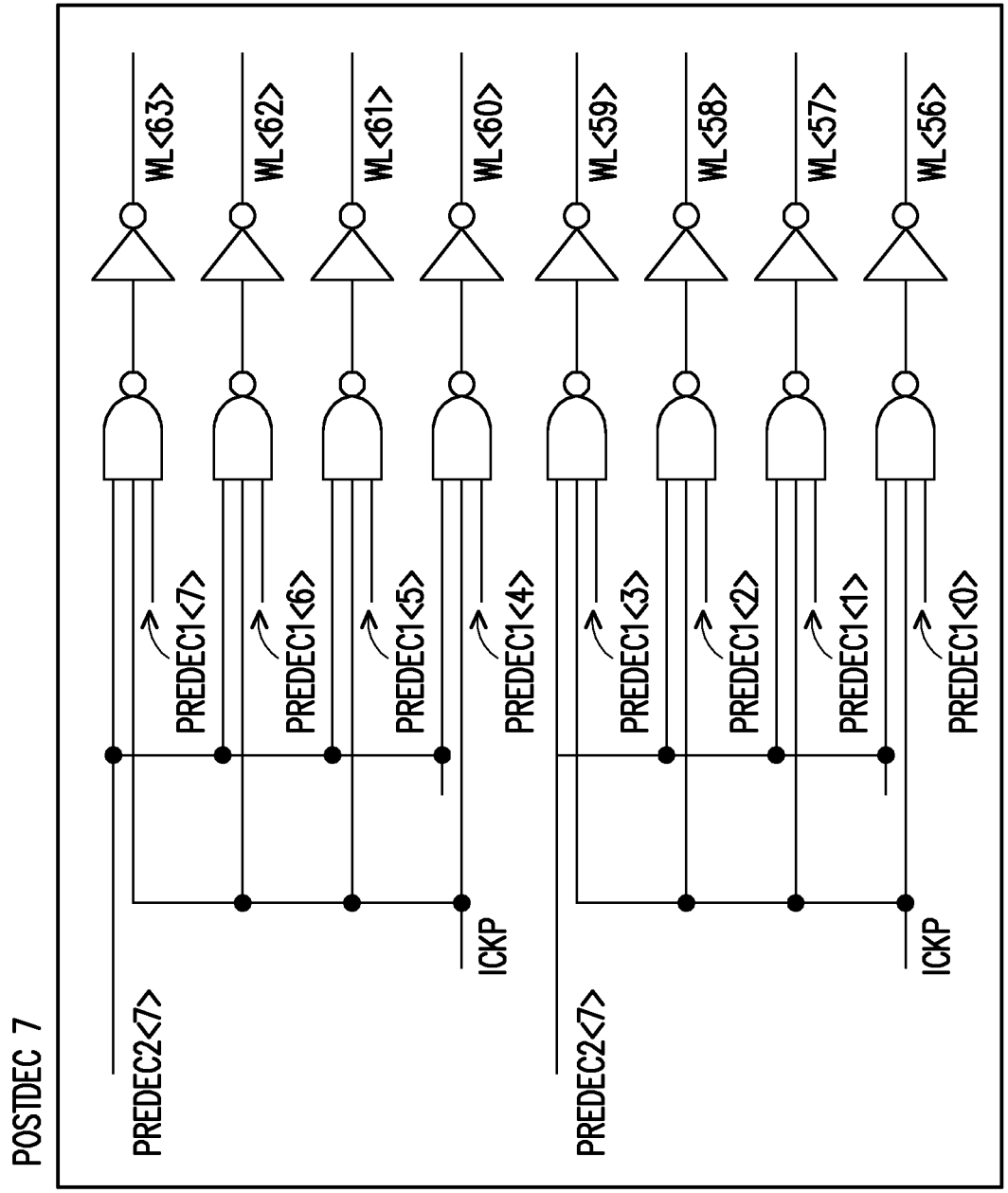
FIG. 9 is a diagram depicting two example postdecoders, each being associated with four word lines in accordance with embodiments.

FIG. 9 is a diagram depicting a postdecoder module associated with eight word lines of a seventh word in the memory. The depicted post decoders receive a selection signal (ICKP) from a predecoder when a first address signal indicates that a portion of memory (e.g., the seventh word of memory) associated with the depicted word lines is an intended destination of a received command (e.g., as described above with respect to FIG. 4). Decoders (e.g., decoder 802 of FIG. 8) translate a second address signal (e.g., LADR[0], LADR[1], LADR[2] of FIG. 8) into a post decoder selection signal (e.g., one of PREDEC1[0:7]), which in combination with the predecoder selection signal (ICKP) and the first address signal (e.g., PREDEC2<7>) activates one of the depicted word lines to initiate an operation. For example, when the first address signal (e.g., PREDEC2<7> generated based on LADR[3] ... LADR[N]) indicate that a word line (e.g., one of WL<56> ... WL<63>) of the data word (e.g., data word 7) associated with the depicted post decoder (e.g., POSTDEC7), PREDEC2<7> is set to a high level and ICKP is activated for the data word as described above with respect to FIG. 4. The second address signal (e.g., one of PREDEC1<0> ... PREDEC<1> set high based on LADR[0] ... LADR[2] as described relative to FIG. 8) is set to activate a particular word line of the data word selected by the first address signal. For example, when the first address signal indicates data word 7 (e.g., PREDEC2<7> is high) and the second address signal indicates the that the sixth word line of data word 7 is to be activated (e.g., PREDEC1<5> is high), then the NAND gate and inverter of WL<61> activate word line 61 according to the ICKP signal (e.g., high signals on PREDEC2<7> and PREDEC1<5> result in the NAND-inverter gate combination passing the ICKP signal through to word line 61.

According to some embodiments, a memory circuit includes a predecoder circuit that is configured to receive a first address signal, a first clock signal, and a second clock signal. The predecoder circuit is configured to generate a selection signal based on the first clock signal and the first address signal. And the predecoder circuit is further configured to maintain the selection signal based on the second clock signal and the first address signal.

In an embodiment, a method of operating a memory circuit receives a first address signal and a first clock signal. The first clock signal is provided to a clock generation circuit. A selection signal is generated based on the first clock signal and the first address signal, and the selection signal is maintained based on the second clock signal and the first address signal.

In a further embodiment, a memory includes a predecoder circuit configured to receive a first address signal, a first clock signal, and a second clock signal, the predecoder circuit being configured to generate a selection signal based on the first clock signal and the first address signal, the predecoder circuit being further configured to maintain the selection signal based on the second clock signal and the first address signal. The memory includes a top array postdecoder and a bottom array postdecoder. The selection signal is routed to one of the top array postdecoder based on the first address signal, the top array postdecoder and the bottom array postdecoders being configured to generate a word line activation signal based on a received selection signal and a second address signal. A top memory array is responsive to a word line signal from the top array postdecoder, and a bottom memory array is responsive to a word line signal from the bottom array postdecoder.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
   a predecoder circuit configured to receive a first address signal, a first clock signal, and a second clock signal;
   the predecoder circuit being configured to generate a selection signal based on the first clock signal and the first address signal;
   the predecoder circuit being further configured to maintain the selection signal based on the second clock signal and the first address signal.

2. The memory circuit of claim 1, wherein the second clock signal is an internal clock signal, wherein activation of the second clock signal is delayed relative to activation of the first clock signal.

3. The memory circuit of claim 2, wherein the second clock signal is activated based on the first clock signal and a chip enable signal.

4. The memory circuit of claim 1, wherein the second clock signal is active for a longer period of time than the first clock signal.

5. The memory circuit of claim 1, wherein the second clock signal is activated prior to deactivation of the first clock signal.

6. The memory circuit of claim 1, further comprising a postdecoder circuit;
   wherein the postdecoder circuit is configured to generate a word line activation signal based on the selection signal and a second address signal.

7. The memory circuit of claim 6, wherein the first address signal is based on a first portion of a received address, and wherein the second address signal is based on a second portion of the received address.

8. The memory circuit of claim 7, wherein the selection signal is transmitted to multiple postdecoder circuits, wherein one of the multiple postdecoder circuits generates the word line activation signal.

9. The memory circuit of claim 1, wherein the predecoder circuit comprises i) a NAND gate that receives the selection signal and the second address signal and ii) an inverter subsequent to the NAND gate.

10. The memory circuit of claim 1, wherein the predecoder circuit comprises a plurality of transistors that are configured to assert the selection signal when i) both the first clock signal and the first address signal are active or ii) both the second clock signal and the first address signal are active.

11. A method of operating a memory circuit, comprising:
receiving a first address signal and a first clock signal;
providing the first clock signal to a clock generation circuit;
generating a selection signal based on the first clock signal and the first address signal; and
maintaining the selection signal based on the second clock signal and the first address signal.

12. The method of claim 11, wherein the first clock signal is an external signal received from outside of the memory circuit, and wherein the second clock signal is generated inside of the memory circuit.

13. The method of claim 11, further comprising:
generating a word line activation signal based on the selection signal and a second address signal.

14. The method of claim 13, wherein the word line activation signal is generated four gate delays after the first address signal is received.

15. The method of claim 13, wherein the first address signal is based on a first portion of an address and the second address signal is based on a second portion of the address, wherein the address is received from outside of the memory circuit.

16. The method of claim 11, wherein the second clock signal is generated based on the first clock signal and a chip enable signal.

17. The method of claim 11, wherein the selection signal is used to generate one or more of a word line activation signal, a bit line precharge signal, a read/write clock signal, and a sense amplifier activation signal.

18. A memory, comprising:
a predecoder circuit configured to receive a first address signal, a first clock signal, and a second clock signal, the predecoder circuit being configured to generate a selection signal based on the first clock signal and the first address signal, the predecoder circuit being further configured to maintain the selection signal based on the second clock signal and the first address signal;
a top array postdecoder and a bottom array postdecoder, the selection signal being routed to one of the top array postdecoder based on the first address signal, the top array postdecoder and the bottom array postdecoders being configured to generate a word line activation signal based on a received selection signal and a second address signal; and
a top memory array responsive to a word line signal from the top array postdecoder and a bottom memory array responsive to a word line signal from the bottom array postdecoder.

19. The memory of claim 18, wherein the top memory array comprises a top-left sub-array and a top-right sub-array, and the bottom memory array comprises a bottom-left sub-array and a bottom-right sub-array.

20. The memory of claim 18, wherein the word line signals are generated five gate delays after the first address signal is received.

* * * * *